(12) United States Patent
Inose

(10) Patent No.: US 6,844,795 B2
(45) Date of Patent: Jan. 18, 2005

(54) SAW FILTER WITH AN IMPROVED ATTENUATION CHARACTERISTIC AT A FREQUENCY ANY MULTIPLE OF AN ATTENUATION POLE FREQUENCY AT ONE OR BOTH SIDES OF A PASS BAND

(75) Inventor: Naoto Inose, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 36 days.

(21) Appl. No.: 10/369,501

(22) Filed: Feb. 21, 2003

(65) Prior Publication Data

US 2003/0227358 A1 Dec. 11, 2003

(30) Foreign Application Priority Data

Jun. 6, 2002 (JP) ........................................ 2002-165644

(51) Int. Cl.[7] ................................................. H03H 9/64
(52) U.S. Cl. ........................ 333/193; 333/194; 333/195; 310/313 B
(58) Field of Search ................................ 333/193–196; 310/313 B, 313 D

(56) References Cited

U.S. PATENT DOCUMENTS

| | | | | |
|---|---|---|---|---|
| 4,295,108 | A | * 10/1981 | Ieki | 333/193 |
| 6,166,611 | A | * 12/2000 | Seki et al. | 333/193 |
| 6,377,140 | B1 | * 4/2002 | Ehara et al. | 333/193 |
| 6,424,238 | B1 | * 7/2002 | Penunuri | 333/187 |

FOREIGN PATENT DOCUMENTS

| | | | | |
|---|---|---|---|---|
| JP | 9-61783 | * 3/1994 | | 333/193 |
| JP | 9-135145 | * 5/1997 | | |

OTHER PUBLICATIONS

Yoshio Satoh, et al, "A Low–Loss Band–Pass Filter Using SAW Resonators", Transactions of the Institute of Electronics, Information and Communication Engineers of Japan, vol. J76–A, No. 2, pp. 245–252 (1993).

Mitsutaka Hikita, et al, "Experiments of High–Performance SAW Filters for Mobile Radio Transceivers", Transactions of the Institute of Electronics, Information and Communication Engineers of Japan, vol. J76–A, No. 2, pp. 236–244 (1993).

Yuji Suzuki, et al, "Coupled–Mode Theory of SAW Periodic Structures", Transactions of the Institute of Electronics, Information and Communication Engineers of Japan, vol. J76–A, No. 2, pp. 87–95 (1993).

* cited by examiner

Primary Examiner—Barbara Summons
(74) Attorney, Agent, or Firm—Rabin & Berdo, P.C.

(57) ABSTRACT

A SAW (Surface Acoustic Wave) filter includes serial arm resonators and parallel arm resonators interconnected in pairs in a multiple-stage, ladder configuration. A resonating device is serially connected to any one of the serial arm resonators and has an attenuation pole frequency higher than that of the serial arm resonator. At the attenuation pole frequency of the serial arm resonator, the resonating device functions as capacitance without performing attenuation. The resonating device has an antiresonance frequency 1.8 times or more but 2.2 times or less, or 2.7 times or more but 3.3 times or less, as high as the antiresonance frequency of the serial arm resonator.

15 Claims, 9 Drawing Sheets

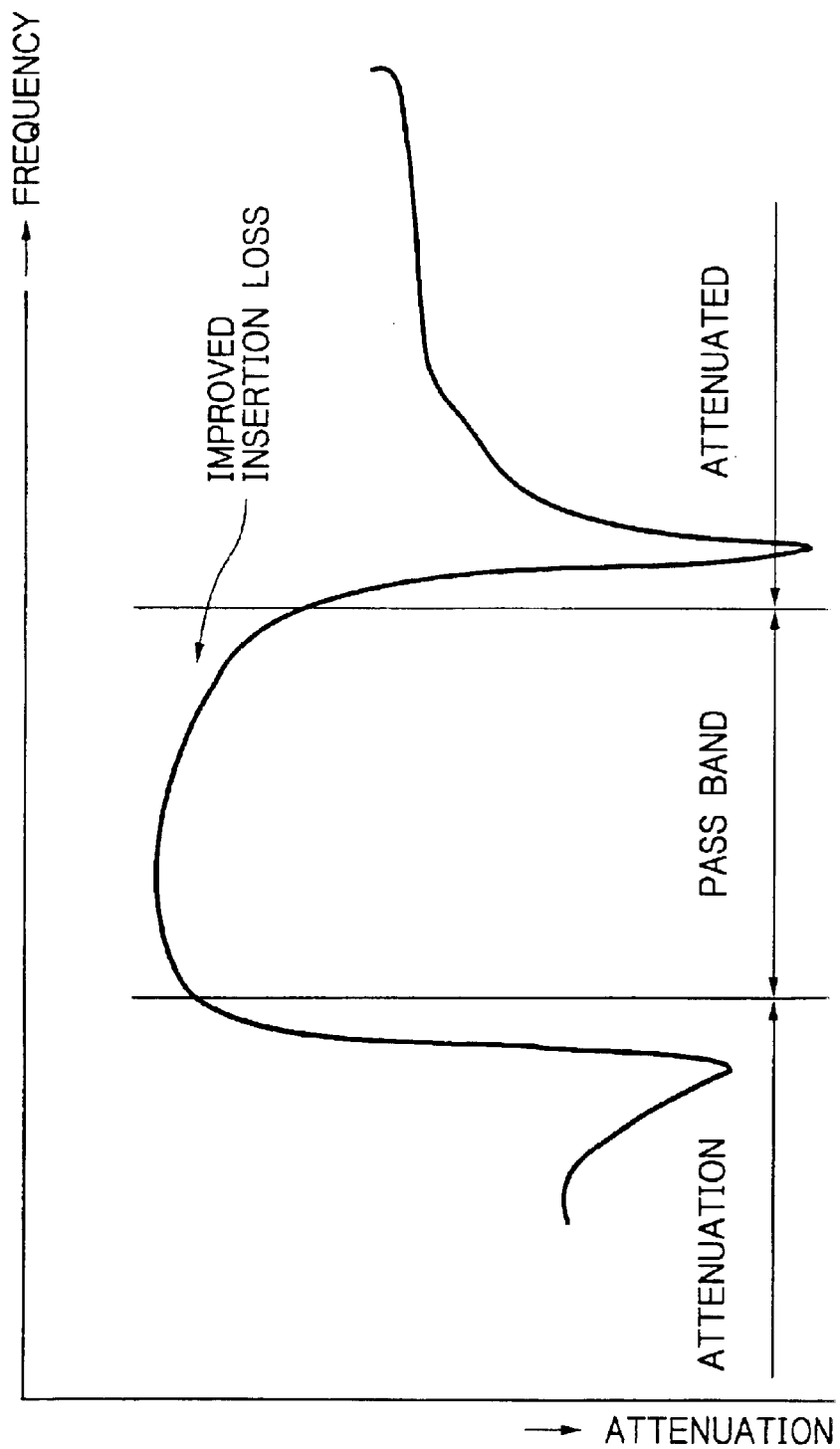

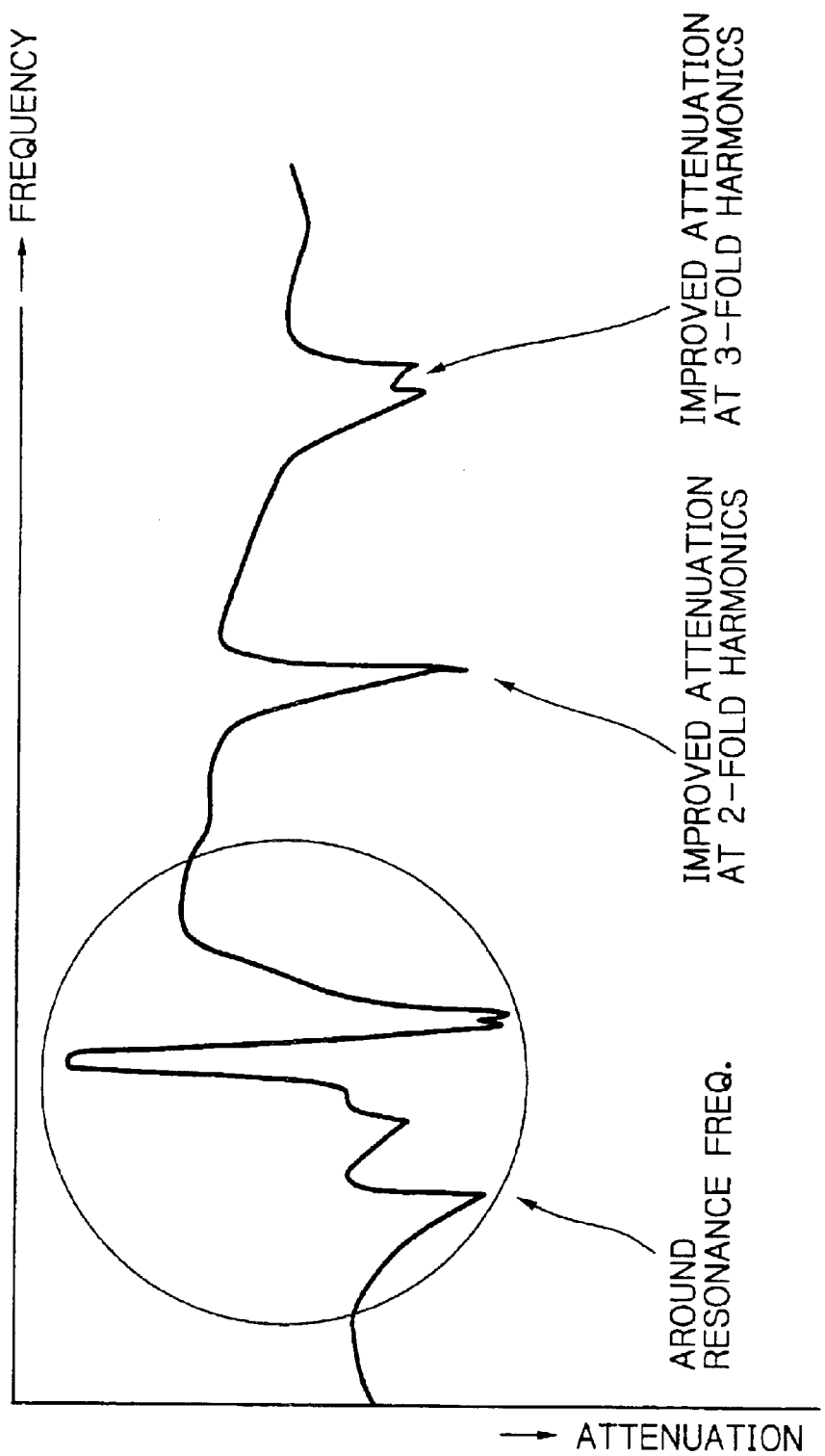

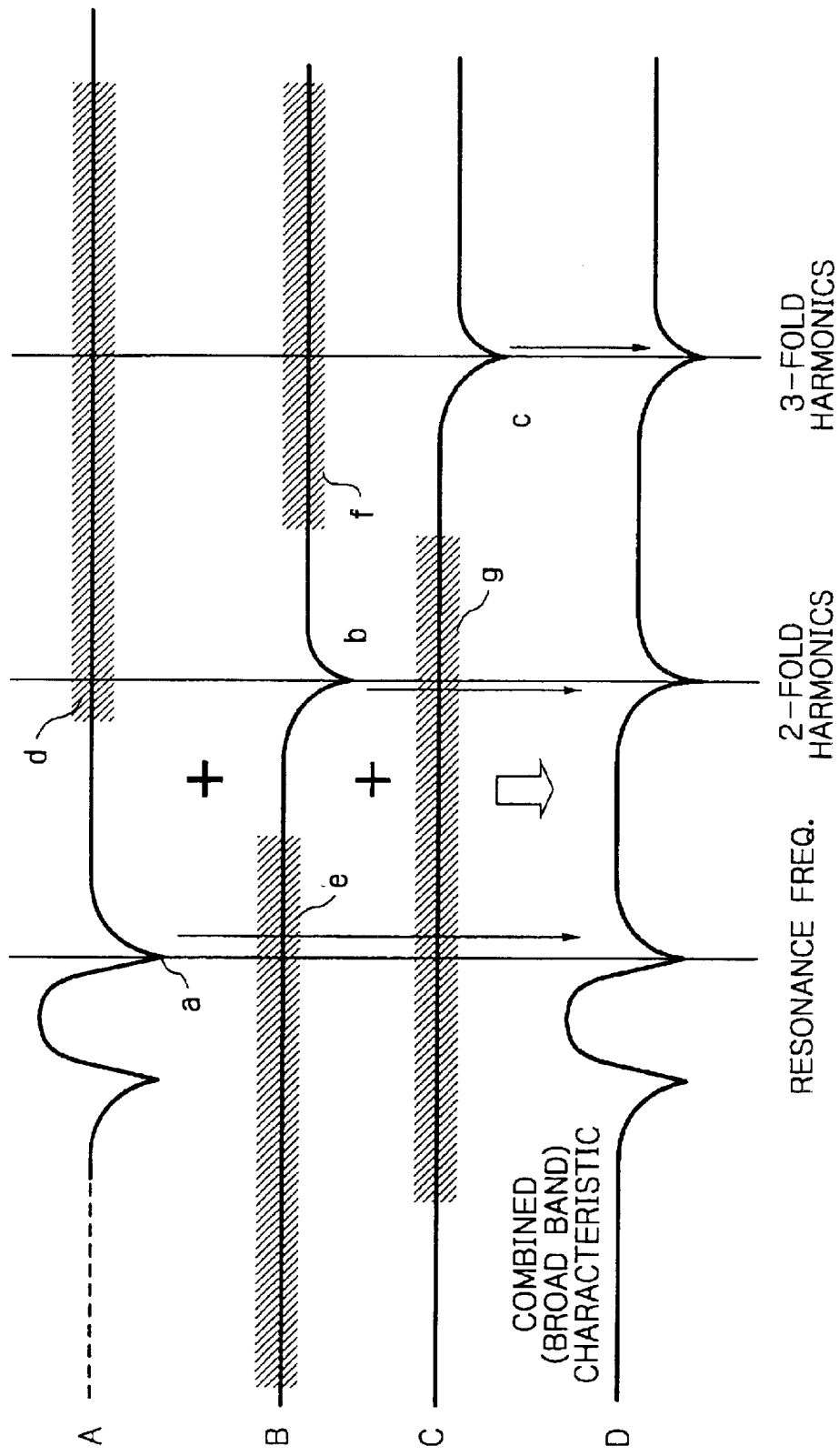

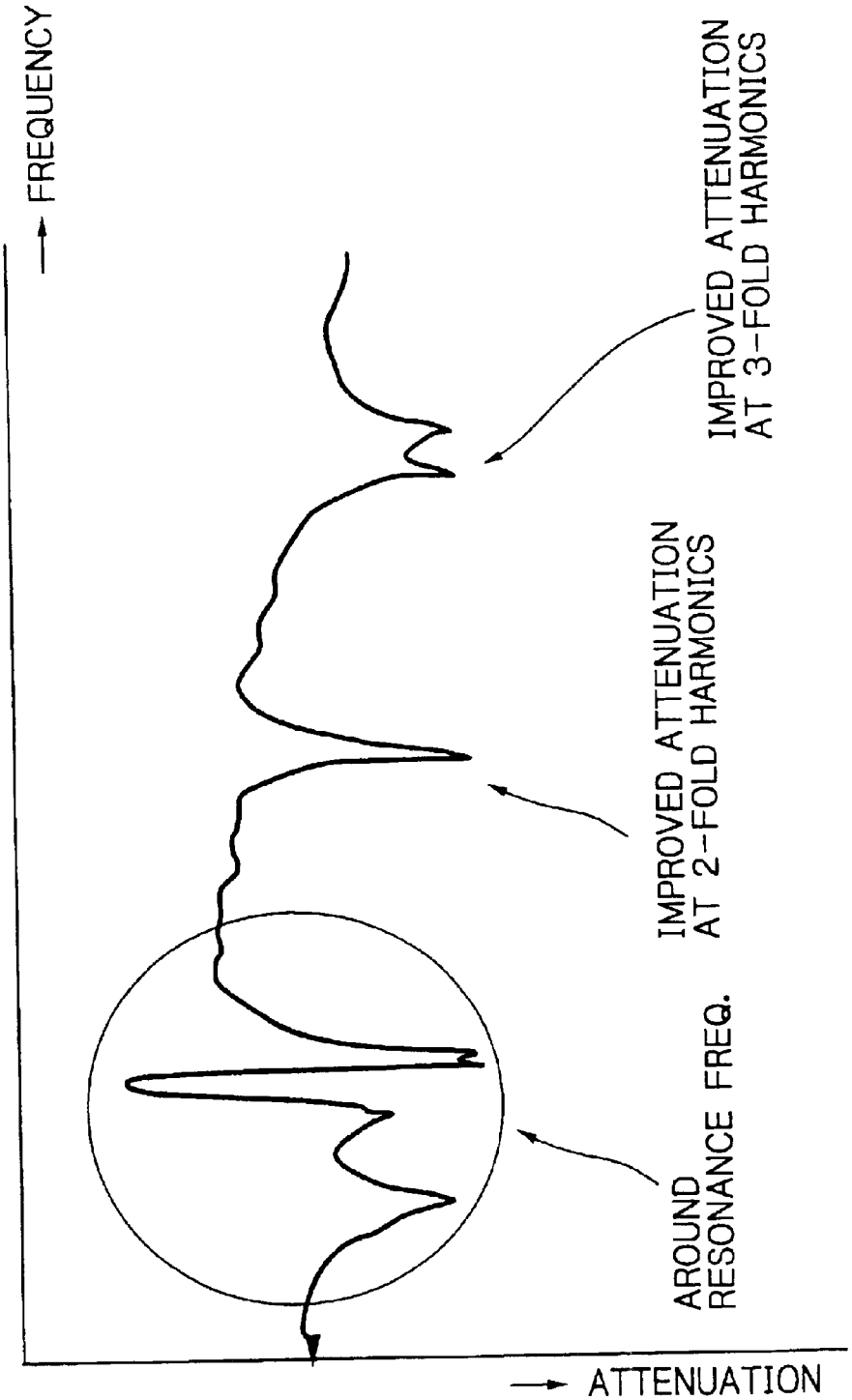

SAW FILTER WITH AN IMPROVED ATTENUATION CHARACTERISTIC AT A FREQUENCY ANY MULTIPLE OF AN ATTENUATION POLE FREQUENCY AT ONE OR BOTH SIDES OF A PASS BAND

BACKGROUND OF THE INVENTION

1. Field of the Invention

The present invention relates to a SAW (Surface Acoustic Wave) filter and more particularly to a SAW filter having an improved attenuation characteristic at a frequency that is any multiple of an attenuation pole frequency at one or both sides of a pass band.

2. Description of the Background Art

Conventional technologies relating to a SAW filter are disclosed in, e.g. Yoshio Satoh, et al, "A Low-Loss Band-Pass Filter Using SAW Resonators", Transactions of the Institute of Electronics, Information and Communication Engineers of Japan, Vol. J76-A, No. 2, pp. 245–252 (1993), Mitsutaka Hikita, et al, "Experiments of High-Performance SAW Filters for Mobile Radio Transceivers", Transactions of the Institute of Electronics, Information and Communication Engineers of Japan, Vol. J76-A, No. 2, pp. 236–244 (1993), and Yuji Suzuki, et al, "Coupled-Mode Theory of SAW Periodic Structures", Transactions of the Institute of Electronics, Information and Communication Engineers of Japan, Vol. J76-A, No. 2, pp. 87–95 (1993). SAW filters taught in this document each include one-terminal pair SAW resonators connected in a ladder configuration. The one-terminal pair SAW resonators constitute serial arms and parallel arms forming a high-frequency attenuation pole and a low-frequency attenuation pole, respectively.

FIG. 1 shows a specific conventional constant K SAW filter in which SAW filters are cascaded in four consecutive stages. This four-stage configuration is also applied to the present invention by way of example. More specifically, as shown in FIG. 1, the constant K SAW filter has a first stage made up of a serial arm resonator 401 and a parallel arm resonator 501, a second stage made up of a serial arm resonator 402 and a parallel arm resonator 502, a third stage made up of a serial arm resonator 403 and a parallel arm resonator 503, and a fourth stage made up of a serial arm resonator 404 and a parallel arm resonator 504. The first to fourth stages are cascaded, as illustrated.

The ladder type SAW filter shown in FIG. 1 has the following problems when a small loss and a great attenuation are desired. First, the SAW filter cannot achieve a small loss or a great attenuation unless the quality factor of resonance and that of antiresonance of the one-terminal pair SAW resonators are increased. Stated another way, it is necessary to reduce the attenuation in the pass band and to increase it at the attenuation pole.

However, if the transposition length or the pair number of comb line electrodes or interdigital transducers (IDTs) is increased in order to increase the quality factor of resonance of the one-terminal pair SAW resonators, then the damping capacitance of the resonators increases while the antiresonance quality factor of the resonators decreases, reducing the attenuation. It is to be noted that damping capacitance refers to capacitance that the resonators have even at a frequency extremely close to DC, i.e. when they do not oscillate. On the other hand, to implement the attenuation value, it is necessary to reduce the transposition length or the pair number of the interdigital transducers. This, however, lowers the quality factor of resonance and thereby aggravates an insertion loss.

Second, as for a mobile telephone extensively used today, it is necessary to attenuate the secondary and tertiary distortion of a power amplifier included in a transmitter circuit. Therefore, the prerequisite with a filter for the duplexer is that it increases an attenuation at two- or threefold harmonics, i.e. harmonics two or three times as high as a resonance or an antiresonance frequency. The one-terminal pair SAW resonators, however, each simply play the role of capacitance at a frequency remote from the resonance frequency. Consequently, as shown in FIG. 2, it is difficult to implement a desired attenuation over a broad range up to the harmonics mentioned above.

If additional L and C circuit components are connected to the filter in order to attain the desired attenuation, then the original characteristics in the pass band and attenuation band are also deteriorated because the resonance quality factor of the LC circuit is low.

As stated above, it is difficult to reduce the insertion loss in the pass band while maintaining a great attenuation up to the two- or threefold harmonics of the resonance or antiresonance frequency.

SUMMARY OF THE INVENTION

It is an object of the present invention to provide a SAW filter capable of achieving a small insertion loss and a great attenuation and insuring the great attenuation over a broad range up to harmonics, which are any multiple of, e.g. two or three times as high as an attenuation pole frequency at one or both sides of the pass band.

In accordance with the present invention, a constant K SAW filter includes serial arm resonators and parallel arm resonators interconnected in pairs in a multiple-stage, ladder configuration. A resonating device is serially connected to any one of the serial arm resonators and has an attenuation pole frequency higher than that of the serial arm resonator. At the attenuation pole frequency of the serial arm resonator, the resonating device functions as capacitance without performing substantial attenuation. The resonating device has an antiresonance frequency 1.8 times or more but 2.2 times or less, or 2.7 times or more but 3.3 times or less, as high as the antiresonance frequency of the serial arm resonator.

Also, in accordance with the present invention, a constant K SAW filter includes serial arm resonators and parallel arm resonators interconnected in pairs in a multiple-stage, ladder configuration. A resonating device is connected to any one of the parallel arm resonators in parallel and has an attenuation pole frequency higher than that of the parallel arm resonator. At the attenuation pole frequency of the parallel arm resonator, the resonating device functions as a capacitance without performing substantial attenuation. The resonating device has a resonance frequency 1.8 times or above but 2.2 times or below, or 2.7 times or above but 3.3 times or below, as high as the resonance frequency of the parallel arm resonator.

BRIEF DESCRIPTION OF THE DRAWINGS

The objects and features of the present invention will become more apparent from consideration of the following detailed description taken in conjunction with the accompanying drawings in which:

FIG. 4 is a graph showing a relation between the frequency and attenuation available with the embodiment in and around a pass band;

FIG. 5 is a graph, similar to FIG. 2, showing a relation between frequency and attenuation available with the embodiment in a broad band;

FIG. 6 demonstrates how the embodiment generates attenuation poles at frequencies of two- and threefold harmonics of an attenuation pole frequency;

FIG. 8 is a graph, similar to FIG. 5, showing a relation between frequency and attenuation available with the alternative embodiment in a broad band.

DESCRIPTION OF THE PREFERRED EMBODIMENTS

Preferred embodiments of the SAW filter in accordance with the present invention will be described hereinafter. Briefly, the illustrative embodiments to be described each are characterized in that additional resonators are connected to the serial arm resonators or the parallel arm resonators of the conventional, ladder type SAW filter described with reference to FIG. 1.

Figure 3A:
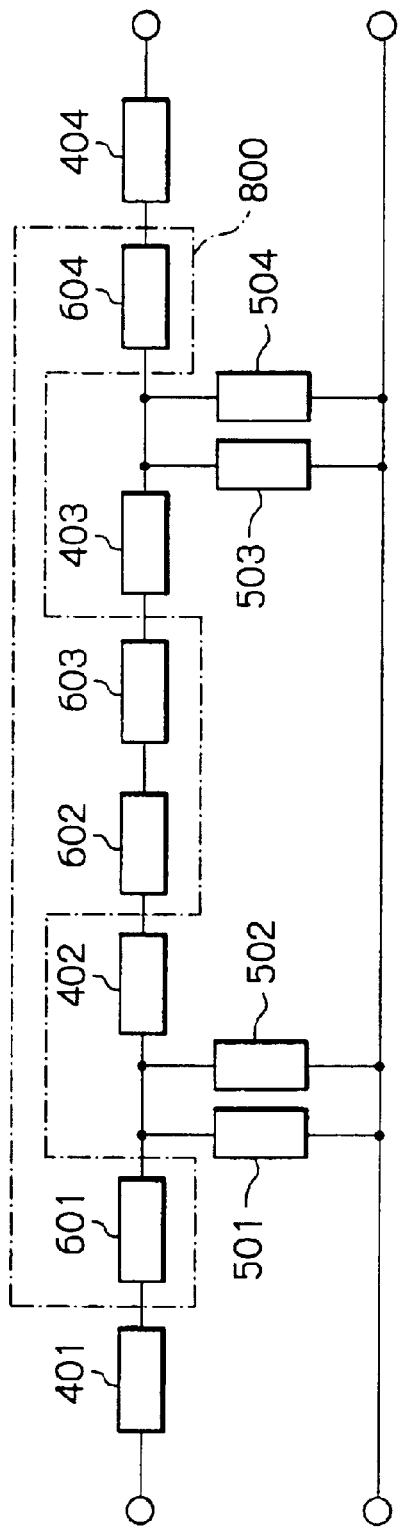
FIGS. 3A and 3B are a schematic circuit diagram and a equivalent circuit diagram, respectively, showing an embodiment of the constant K SAW filter in accordance with the present invention.
Figure 3B:
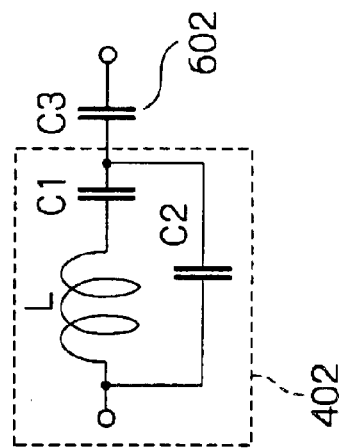

Referring to FIGS. 3A and 3B, in an embodiment of the SAW filter in accordance with the invention, at any one of the consecutive stages of the SAW filter, an additional resonating device is serially connected to the serial arm resonator. The additional resonating device has its attenuation pole at a frequency that is any multiple of the antiresonance frequency of the serial arm resonator, i.e. an attenuation pole frequency at the higher frequency side with respect to a pass band. The multiple mentioned above may be twice or three times by way of example.

Figure 1:
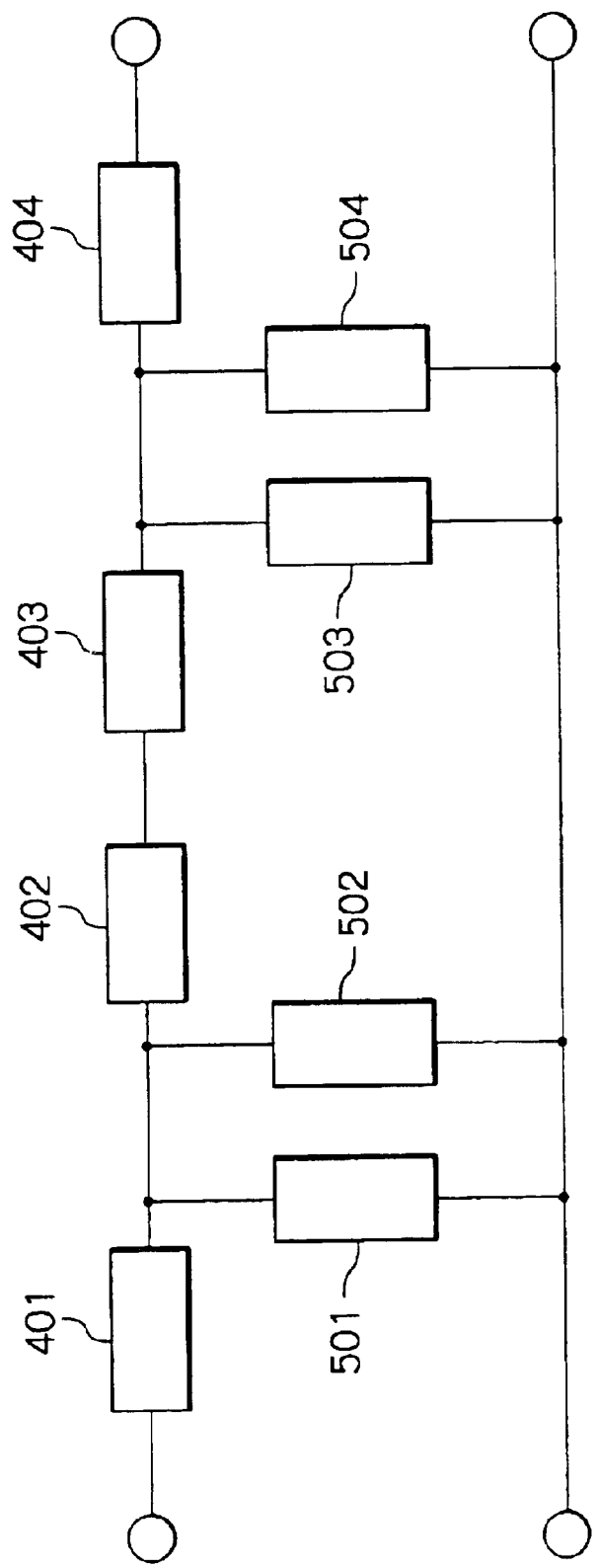
FIG. 1 is a schematic circuit diagram showing a conventional constant K SAW filter in which unit SAW filters are cascaded in a four-stage ladder configuration.

As shown in FIG. 3A, the SAW filter of the illustrative embodiment, like the conventional ladder type SAW filter of FIG. 1, includes a first stage made up of a serial arm resonator 401 and a parallel arm resonator 501, a second stage made up of a serial arm resonator 402 and a parallel arm resonator 502, a third stage made up of a serial arm resonator and a parallel arm resonator 503, and a fourth stage made up of a serial arm resonator 404 and a parallel arm resonator 504. In the figures, identical reference numerals designate like structural elements.

The illustrative embodiment corresponds to circuitry in which additional resonators 601, 602, 603 and 604 are inserted in the conventional filter circuit of FIG. 1. The resonators 601 through 604 constitute resonating devices characterizing the illustrative embodiment. A resonating device refers to, in the constant K SAW filter of FIG. 1, a resonator connected to any desired arm in order to establish an attenuation pole frequency that is an integral or any other multiple of, e.g. two or three times as high as the attenuation pole frequency particular to the filter. The additional resonating device is not limited to a SAW device, but may be a bulk-wave piezoelectric resonator constituted by a separate piezoelectric substrate or either one of a ferroelectric monocrystalline substrate and a ferroelectric ceramics substrate.

The additional resonating devices 601 through 604 inserted in the serial arm are formed on a single device chip or substrate 800, and each has its attenuation pole lying in a frequency range higher than an attenuation pole established by the serial arm resonators 401 through 404 at the higher frequency side. More specifically, the resonating devices 601 and 603 each have the attenuation pole thereof at a frequency twice as high as the attenuation pole frequency formed by each serial arm resonator at the higher frequency side. Likewise, the additional resonating devices 602 and 604 each have the attenuation pole thereof at a frequency three times as high as the attenuation pole frequency formed at the higher frequency side. In this manner, the serial-arm resonating devices 601 through 604 each having two or three times higher antiresonance frequency are serially connected to the serial arm resonators 401 through 404, respectively.

As stated above, in the illustrative embodiment, any one of a plurality of serial arm resonators arranged in a serial arm is provided with a higher antiresonance frequency than the other serial arm resonators. For example, while the antiresonance frequency of desired one of the serial arm resonators may, in principle, be selected to be two or three times as high as the lowest antiresonance frequency, the former should, in practice, preferably be 1.8 times or more but 2.2 times or less, or 2.7 times or more but 3.3 times or less, as high as the latter, as taught by experience.

FIG. 3B shows an equivalent circuit representative of the serial arm resonator 402 and serial-arm resonating device 602 by way of example. As shown, in and around the pass band, the serial arm resonator 402 is equivalent to circuitry consisting of a serial connection of reactance L and capacitance C1 and damping capacitance C2 connected in parallel to the serial connection. Also, in and around the pass band, the additional serial-arm resonating device 602 is equivalent to capacitance C3 serially connected to the serial arm resonator 402. It is to be noted that at the frequency two or three times as high as the antiresonance frequency of the serial arm resonator, an equivalent circuit holds which is different from the equivalent circuit of FIG. 3B, as will be described later specifically.

FIG. 4 plots a curve representative of a relation between the frequency and the attenuation ratio available with the illustrative embodiment in and around the pass band of the SAW filter. FIG. 5 also plots a curve representative of a relation similar to the relation of FIG. 4, but pertaining to a broader band.

With the configuration described above, the illustrative embodiment achieves the following unprecedented advantages (1) and (2).

(1) As shown in FIG. 4, in and around the pass band, the illustrative embodiment noticeably improves the attenuation at the attenuation poles at both sides of the pass band, compared to the conventional SAW filter.

Figure 2:
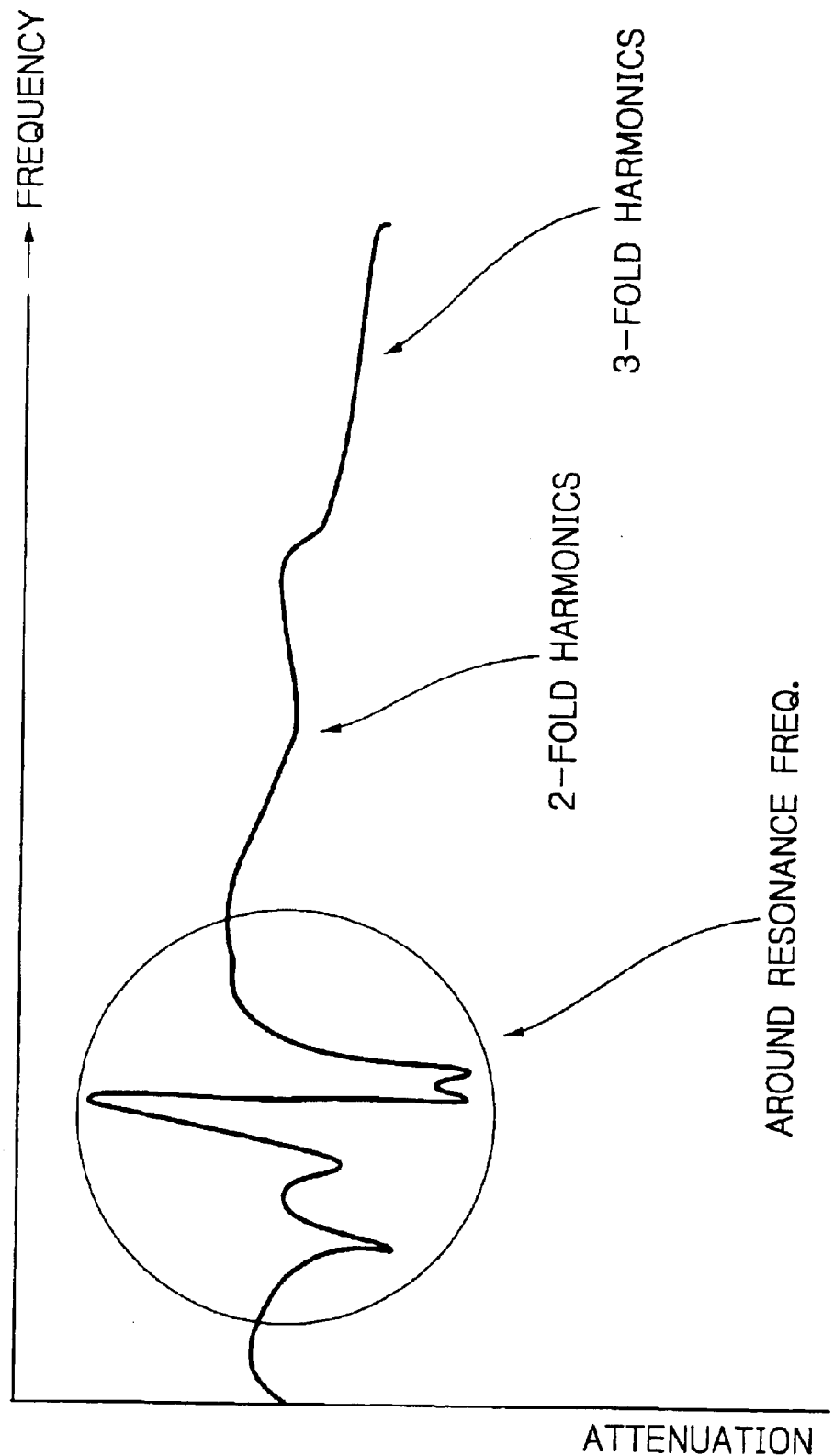
FIG. 2 is a graph showing a relation between the frequency and attenuation in a broad band particular to the conventional SAW filter of FIG. 1.

(2) Also as shown in FIG. 5 that is contrastive to FIG. 2, in the broader band, the illustrative embodiment remarkably improves the attenuation at and around the resonance frequency, at the twofold harmonics, and at the threefold harmonics.

Why the advantages (1) and (2) are achievable with the illustrative embodiment will be described more specifically with reference to FIG. 6.

FIG. 6 demonstrates how attenuation poles are generated in the constant K SAW filter of the illustrative embodiment at two- and threefold harmonics of the attenuation pole frequency. In FIG. 6, a waveform A is representative of a relation between the frequency and the attenuation ratio of the resonators having the previously stated antiresonance frequency. As shown, in the frequency range higher than the antiresonance frequency, e.g. two or three times as high as the lowest antiresonance frequency, in practice 1.8 times or more but 2.2 times or less, or 2.7 times or more but 3.3 times or less, as high as the antiresonance frequency, the curve A is substantially horizontal or flat in the figure because each resonator is equivalent to capacitance, as shown in FIG. 3B.

In FIG. 6, waveforms B and C are respectively representative of relations between the frequency and the attenuation ratio of the other serial arm resonators, i.e. resonating devices having frequencies two times and three times as high as the antiresonance frequency at the side higher than the pass band. As shown, the waveforms B and C are also substantially horizontal in the frequency range higher than the antiresonance frequency of the serial arm resonators because each resonator is equivalent to capacitance.

The SAW filter of the illustrative embodiment has a characteristic plotted by a curve D in FIG. 6, in which the waveform A derived from the ladder-connected resonators are combined with the waveforms B and C derived from the resonating devices having the frequency two times and three times as high as the lowest antiresonance frequency, respectively. It is noteworthy that substantially horizontal ranges d, f and g included in the curves A, B and C, respectively, do not influence each other at all when combined.

The serial arm resonators stated above all are formed on a single substrate. The serial-arm resonating devices other than the serial arm resonator having the lowest antiresonance frequency are implemented by bulk-wave piezoelectric resonators operable in, e.g. a thickness or a flexural oscillation mode and constituted by a separate piezoelectric substrate or either one of a ferroelectric monocrystalline substrate and a ferroelectric ceramics substrate.

The serial-arm resonating devices other than the serial arm resonator having the lowest antiresonance frequency are implemented as piezoelectric thin-film resonators formed on a single substrate. In the SAW filter, the piezoelectric thin-film resonators arranged on a single substrate are implemented by any one of an $LiTaO_3$ (lithium tantalate) thin film, an $LiNbO_3$ (lithium niobate) thin film, a ZnO (zinc oxide) thin film, and an AlN (aluminum nitride) thin film.

The resonating devices for the SAW filter are implemented by any one of an $LiTaO_3$ substrate having a crystal growth plane of 36° Y-X, an $LiTaO_3$ substrate having a crystal growth plane of 112° Y-X, an $LiTaO_3$ substrate having a crystal growth plane of Y-Z, an $LiNbO_3$ substrate having a crystal growth plane of 64° Y-X, an $LiNbO_3$ substrate having a crystal growth plane of 41° Y-X, an $LiNbO_3$ substrate having a crystal growth plane of 128° Y-X, an $LiNbO_3$ substrate having a crystal growth plane of Y-Z, a PZT (lead zirconate titanate) piezoelectric ceramics substrate, and a $PbTiO_3$ (lead titanate) piezoelectric ceramics substrate.

In the constant K SAW filter of the illustrative embodiment, a plurality of interdigital transducers are formed on a piezoelectric substrate or either one of a ferroelectric monocrystalline substrate and a ferroelectric ceramics substrate at a preselected pitch, constituting a one-terminal pair SAW resonator. Serial arm and parallel arm resonators, each implemented by such a one-terminal pair SAW resonator, are interconnected in a multiple-stage, ladder configuration. This configuration can approximate an equivalent lumped constant circuit which has resonance (serial resonance) and antiresonance (parallel resonance), and in which a serial connection of reactance L and capacitance C1 is connected in parallel with capacitance C2, FIG. 3B. In each serial arm, the one-terminal pair SAW resonator constituting a constant K type is connected in series to at least one resonating device having resonance and antiresonance at frequencies different from the above resonator.

Generally, a one-terminal SAW resonator has a quality factor of at least 100 as to resonance and antiresonance. Therefore, at and around the resonance and antiresonance frequencies of the serial arm of each stage, the resonating device, which is included in the serial arm and resonant and antiresonant to the two- or threefold harmonics, simply plays the role of serial capacitance. As for the serial arm at the second stage, for example, in and around the pass band, part of the equivalent circuit of FIG. 3B indicated by a dotted block corresponds to the resonator 402 as in FIG. 1 while the capacitance C3 outside of the dotted block 402 corresponds to the additional resonating device 602. On the other hand, at the antiresonance frequency of the resonating device 602, the resonating device 602 performs antiresonance and generates an attenuation pole while the serial arm resonator 402 simply plays the role of capacitance. This relation between the resonator 402 and the resonating device 602 is shown in FIG. 6.

In FIG. 6, the waveform A is representative of the relation between the frequency and the attenuation ratio of the conventional constant K SAW filter. The waveform B is representative of the relation between the frequency and the attenuation ratio having an attenuation pole at the twofold harmonics, which is implemented by the resonating devices 601 and 603. Further, the waveform C is representative of the relation between the frequency and the attenuation ratio having an attenuation pole at the threefold harmonics, which is implemented by the resonating devices 602 and 604. The SAW filter of the illustrative embodiment combines the waveforms A, B and C, as depicted with waveform D.

In FIG. 6, the range d included in the waveform A, ranges e and f included in the waveform B and range g included in the waveform C each are two- or threefold of its own attenuation pole frequency, and therefore substantially horizontal or flat in the figure as to characteristic. Signals in the above ranges d through g have no influence on the attenuation pole characteristic. More specifically, the characteristic of the attenuation pole a of the signal A faithfully appears in the combined waveform D without being effected by the range e of the signal B or the range g of the signal C at all.

It will therefore be seen that when an attenuation pole should be generated at harmonics that is any multiple of the attenuation pole frequency of the constant K SAW filter, a resonating device having an attenuation pole at harmonics is added to the SAW filter. More specifically, at and around threefold harmonics, the circuitry inside the dotted block of FIG. 3B and serially inserted capacitance C3 correspond to the resonating device 602 and serial arm resonator 402, respectively. Stated another way, inserting the serial capacitance C3 is equivalent to reducing the damping capacitance of the serial arm resonator, so that the serial arm as a whole constitutes a frequency elevation type, energy-confining, one-terminal pair SAW resonator. This not only reduces an insertion loss and increases the attenuation, but also generates attenuation poles at the two- and threefold harmonics.

If a serial-arm resonating device other than a resonator having the lowest antiresonance frequency is connected to each of the consecutive stages, then the damping capacitance of the serial arm resonator is reduced and, in turn, increases the quality factor of resonance and antiresonance of the resonator. Consequently, the insertion loss of the entire filter is reduced while the attenuation is increased at the attenuation pole frequency positioned at the side higher than the pass band. At the same time, the attenuation is increased at the two- and threefold harmonics.

In principle, in the SAW filter, the damping capacitance of the serial-arm resonating device whose antiresonance frequency is two or three times as high as the lowest antiresonance frequency is made equal to or higher than the damping capacitance of the serial arm resonator having the lowest antiresonance frequency. In this condition, if the resonating devices 601, 602, 603 and 604 are adjusted in antiresonance frequency such that the attenuation poles appear at the two- and threefold harmonics with the resonating devices 601 and 603 and the resonating devices 602 and 604, respectively, then there can be implemented the desired attenuation at both of the two- and threefold harmonics.

If the resonating device to be inserted has damping capacitance two times or more higher than the damping capacitance of the associated serial arm resonator, then the insertion loss is aggravated little. Each resonating device included in the illustrative embodiment should preferably be positioned between the serial arm resonators in the aspect of characteristics.

As stated above, in the illustrative embodiment, a serial-arm resonating device having antiresonance frequency two or three times higher than that of an attenuation pole positioned at the higher frequency side with respect to the pass band is serially connected to a serial arm resonator, which constitutes the above attenuation pole.

The SAW filter of the illustrative embodiment has various advantages, as enumerated below.

(1) The attenuation is increased with respect to two- or threefold harmonics without increasing an insertion loss.

(2) Voltage to be applied to the serial arm resonator, which constitutes the attenuation pole, is reduced, so that the resistance of the serial arm resonator to voltage or power is increased.

(3) A printed circuit board on which the filter is fabricated is reduced in size because additional parts for trapping the two- and threefold harmonics are not necessary.

(4) Basically, the SAW filter can be constructed only if serial-arm resonating devices with antiresonance frequencies of different multiples are mounted on the printed circuit board. Therefore, special manufacturing steps that would increase the cost are not necessary.

While the illustrative embodiment has been shown and described as arranging the resonators on a single device substrate, the resonators may be formed on separate substrates different in cut angle or in material and connected together by, e.g. bonding wires. If desired, the illustrative embodiment may be modified to include five or more consecutive stages each including a serial-arm resonating device with antiresonance frequency of a particular multiple, thereby further enhancing the advantages described above.

Alternatively, resonators 601 through 604 may be implemented by piezoelectric resonators, each of which has resonance and antiresonance characteristics, i.e. bulk-wave resonators, and is serially connected to the serial arm resonator of a particular stage. Each piezoelectric resonator has an attenuation pole at the frequency two- or threefold of the attenuation pole frequency formed by the serial arm resonator at the higher frequency side with respect to the pass band. The piezoelectric resonators and piezoelectric thin-film resonators, which will be described later, constitute resonating devices like the additional resonators described above.

In the alternative embodiment, the resonating devices or piezoelectric resonators 601 through 604 to be serially inserted in the consecutive stages are positioned outside of the resonator substrate. The resonating devices each have an attenuation pole at a frequency higher than the attenuation pole frequency formed by associated one of the serial arm resonators 401 through 404 at the higher frequency side with respect to the pass band. The resonating devices 601 through 604 are serially connected to the serial arm resonators 401 through 404, respectively, in the same manner as in FIG. 3A, and each has the two- or threefold antiresonance frequency.

Generally, the resonance and antiresonance of each bulk-wave piezoelectric resonator has a quality factor of at least 100. Therefore, at and around the resonance and antiresonance frequencies of the serial arm at each stage, the inserted resonator that is resonant and antiresonant to the two- or threefold harmonics simply functions as serial capacitance.

As for the serial arm at the second stage, for example, in or around the pass band, the inside of the dotted block shown in FIG. 3A corresponds to the serial arm resonator 402 while the serially inserted capacitance C3 corresponds to the resonating device or piezoelectric resonator 602. On the other hand, at the antiresonance frequency of any one of the resonating devices 601 through 604, the resonating device performs antiresonance and generates an attenuation pole while associated one of the serial arm resonators 401 through 404 simply serves as capacitance. Likewise, at or around the threefold harmonics, the inside of the dotted block and serially inserted capacitance C3 correspond to the resonating device 602 and serial arm resonator 402, respectively. Stated another way, inserting the serial capacitance C3 is equivalent to reducing the damping capacitance of the serial arm resonator, so that the serial arm as a whole constitutes a frequency elevation type, energy confinement, one-terminal pair SAW resonator. This not only reduces an insertion loss and increases the attenuation, but also generates an attenuation pole at the two- and threefold harmonics.

The piezoelectric resonators of the alternative embodiment, like the resonating devices of the earlier described embodiment, combine the signals in the manner described with reference to FIG. 6.

The piezoelectric resonator inserted in each of the consecutive stages reduces the damping capacitance of the associated serial arm resonator and thereby increases the quality factor of resonance and antiresonance of the resonator. This successfully reduces the insertion loss and increases the attenuation of the entire filter while increasing the attenuation in both of the portions two times and three times as high as the attenuation pole frequency of the constant K SAW resonators, i.e. serial arm resonators as well.

If the piezoelectric resonators or resonating devices 601, 603, and 602, 604 are matched to two- and threefold harmonics of the attenuation pole frequency of the constant K SAW resonators, respectively, it is then possible to implement a desirable attenuation characteristic at both of the two- and threefold harmonics and to assign harmonics of any desired multiple to the individual piezoelectric resonator.

If the damping capacitance of the piezoelectric resonator inserted in each stage is two times or more higher than that of the associated serial-arm resonator, then the insertion loss is aggravated little for the same reason as described in relation to one-terminal pair SAW resonators formed on a single substrate. Only if the piezoelectric resonator and serial-arm resonator are formed on substrates separate from but are electrically connected to each other, their resonation waves do not adversely effect each other.

To further enhance the effects described above, the damping capacitance of the piezoelectric resonator inserted in each stage may be selected to be two times or more as high as that of the associated serial arm resonator. More specifically, serial capacitance inserted in each stage equivalently reduces the damping capacitance of the serial arm resonator, so that the serial arm as a whole constitutes a frequency elevation type, energy confinement, one-terminal pair SAW resonator. The serial capacitance is therefore successful to reduce the insertion loss and increase the attenuation while generating attenuation poles at the two- and threefold harmonics.

As far as practical use is concerned, the antiresonance frequency of the resonating device serially connected to the serial arm resonator in each stage should preferably be 1.8 times or more but 2.2 times or less, or 2.7 times or more but 3.3 times or less, as high as the antiresonance frequency of the serial arm resonator.

The resonating devices each connected to a particular serial arm resonator may be implemented as one-terminal pair SAW resonators formed on a single substrate. As for the bulk-wave piezoelectric resonating devices, the resonating devices to be serially connected to the serial arm resonators are formed on a separate piezoelectric substrate or either one of a ferroelectric monocrystalline substrate and a ferroelectric ceramics substrate. Further, the resonating devices to be serially connected to the serial arm resonators may be formed on a single substrate. Moreover, the piezoelectric thin-film resonators formed on a single substrate may be implemented by any one of an $LiTaO_3$ thin film, an $LiNbO_3$ thin film, a ZnO thin film and an AlN thin film.

The piezoelectric substrate, ferroelectric monocrystalline substrate and ferroelectric ceramics substrate each may be constituted by any one of an $LiTaO_3$ substrate having a crystal growth plane of 36° Y-X, an $LiTaO_3$ substrate having a crystal growth plane of X-112° Y, an $LiTaO_3$ substrate having a crystal growth plane of Y-Z, an $LiNbO_3$ substrate having a crystal growth plane of 64° Y-X, an $LiNbO_3$ substrate having a crystal growth plane of 41° Y-X, an $LiNbO_3$ substrate having a crystal growth plane of 128° Y-X, an $LiNbO_3$ substrate having a crystal growth plane of Y-Z, a PZT piezoelectric ceramics substrate, and a $PbTiO_3$ piezoelectric ceramics substrate.

The one-terminal pair SAW resonators of the thus modified embodiment also achieve the characteristics shown in FIGS. 4 and 5 and operate in the same manner as described with reference to FIG. 6.

As stated above, in the modified embodiment, a piezoelectric resonator, or bulk-wave resonator, having resonance and antiresonance characteristics is serially connected to a serial arm resonator of each stage. With this configuration, the modified embodiment achieves the following advantages (1) through (3).

(1) Two- or threefold harmonics can be attenuated by a greater amount without increasing an insertion loss.

(2) The piezoelectric resonator serially connected to the serial arm resonator at each stage lowers voltage to be applied to the serial arm resonator, so that the resistance of the serial arm resonator to voltage or power is increased.

(3) Basically, the SAW filter can be constructed only if serial arm resonating devices with antiresonance frequencies of different multiples are mounted on the printed circuit board. Therefore, special fabricating steps that would increase the cost are not necessary.

While the piezoelectric resonators of the modified embodiment are formed on separate substrates and connected to each other by bonding wires, the resonators may be directly connected by, e.g. bumps. If desired, the embodiment may further be modified to include five or more consecutive stages each including a serial arm resonating device with antiresonance frequency of a particular multiple, thereby further enhancing the advantages described above. Further, the resonating device inserted in each stage can achieve the same advantages even if positioned between any other serial arm resonators. In addition, the piezoelectric resonators formed on separate substrates in the embodiment may be replaced with piezoelectric thin-film resonators formed on a single substrate.

Figure 7A:
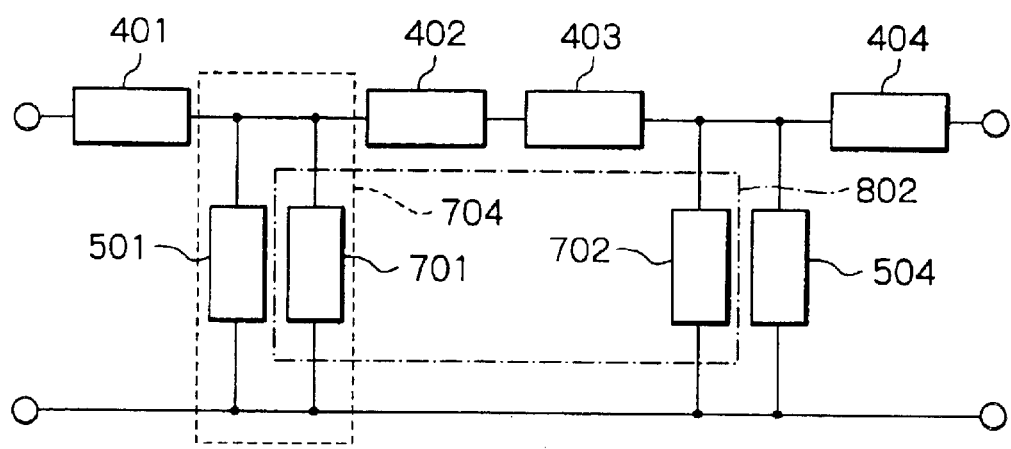
FIGS. 7A and 7B are a schematic block diagram, similar to FIGS. 3A and 3B, showing an alternative embodiment of the present invention.
Figure 7B:
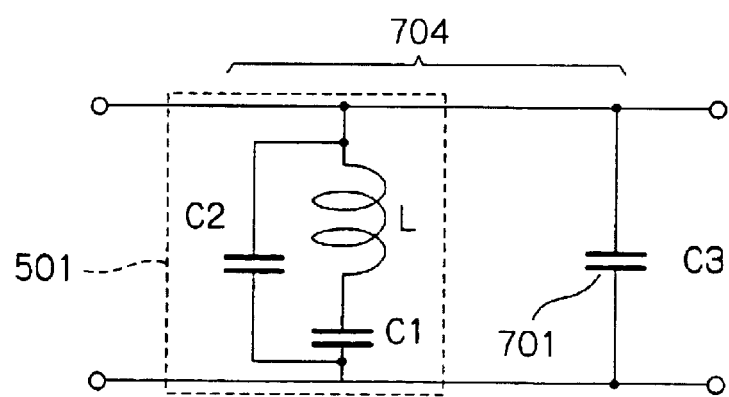

Reference will be made to FIGS. 7A and 7B for describing an alternative embodiment of the SAW filter in accordance with the present invention. Briefly, a ladder type SAW filter of the illustrative embodiment additionally includes resonating devices inserted in the consecutive stages in parallel to the parallel arm resonators as distinguished from the serial arm resonators. The additional resonating devices each are resonant to a frequency two or three times as high as the attenuation pole formed by the associated parallel arm resonator at the lower frequency side with respect to the pass band.

As shown in FIG. 7A, in the SAW filter, the serial arm resonators 401 through 404 and parallel arm resonators 501 and 504 are arranged in the same manner as in the conventional ladder type SAW filter, FIG. 1. Parallel arm resonators 701 and 702 are respectively substituted for the parallel arm resonators 502 and 503, FIG. 1, of the prior art circuitry, and formed on a single chip 802. The parallel arm resonators 701 and 702 are inserted in the consecutive stages of the SAW filter in parallel to the conventional parallel arm resonators 501 and 504, respectively, and each have an attenuation pole at a frequency higher than the attenuation pole frequency formed by the associated resonator 501 or 504 at the lower frequency side with respect to the pass band. In the illustrative embodiment, the parallel arm resonators 701 and 702 serve as the resonating devices whose configuration has been defined earlier.

More specifically, the resonating device 701 is connected in parallel to the first-stage parallel arm resonator 501 to constitute a second stage, and has resonance frequency two times as high as the resonance frequency of the resonator 501. The other resonating device 702 is connected in parallel to the fourth-stage parallel arm resonator 504 to constitute a third stage, and has resonance frequency three times as high as the resonance frequency of the resonator 504.

Generally, the resonance and antiresonance of a one-terminal SAW resonator have a quality factor of at least 100. It follows that at and around the resonance frequency and antiresonance frequency of the parallel arm of each stage, the additional resonating device that is resonant and antiresonant to the two- or threefold harmonics simply plays the role of capacitance. On the other hand, at the resonance frequency of the resonating device 701 or 702, the resonating device 701 or 702 performs resonance and generates an attenuation pole while the parallel arm resonator 501 or 504 simply plays the role of capacitance. Stated another way, so inserting parallel capacitance in each stage is equivalent to increasing the damping capacitance of the associated parallel arm resonator, so that an attenuation pole is generated in the two- or threefold harmonics of the resonance frequency on the lower frequency side with respect to the pass band. Consequently, the attenuation available with the entire filter is increased in the two- and threefold harmonics of the attenuation pole frequency at the lower frequency side.

To insert the resonating device 701 and 702 without noticeably increasing the insertion loss, the damping capacitance of each of the parallel arm resonators 501 and 504 should only be halved. This can be done only if the damping capacitance of each of the resonating devices 701 and 702 is made equal to that of the parallel arm resonator 501 or 504 associated therewith. More specifically, the circuitry of FIG. 7A is equivalent to the circuit of FIG. 1 if the parallel arm resonators 502 and 503, FIG. 1, are replaced with resonators identical in damping force with the resonators 502 and 503, but having resonance frequencies in the two- and threefold harmonics, respectively, of the attenuation pole frequency.

FIG. 7B shows an equivalent circuit 704 established by the parallel arm resonator 501 and additional resonating device 701 by way of example. As shown, in and around the pass band, the parallel arm resonator 501 is represented by a serial connection of reactance L and capacitance C1, and damping capacitance C2 connected in parallel to the serial connection. On the other hand, the additional resonating device 701 is represented by capacitance C3 connected in parallel to the parallel arm resonator 501. As for the frequency two or three times as high as the attenuation pole frequency formed by the parallel arm resonator at the lower frequency side with respect to the pass band, an equivalent circuit different from the circuit shown in FIG. 7B holds, as will be described later specifically.

FIG. 8 shows a relation between the frequency and the attenuation ratio available with the illustrative embodiment in a broad band.

With the configuration described above, the illustrative embodiment achieves the following unprecedented advantages (1) and (2).

(1) As shown in FIG. 4, the illustrative embodiment noticeably improves the attenuation at the attenuation poles at both sides of the pass band, compared to the conventional SAW filter.

(2) As shown in FIG. 8, the illustrative embodiment realizes a far greater amount of attenuation around the pass band and realizes far greater attenuation at the two- and threefold harmonics, compared to the attenuation shown in FIG. 2. Why these advantages are achievable with the illustrative embodiment will be described more specifically with reference to FIG. 9.

Figure 9:
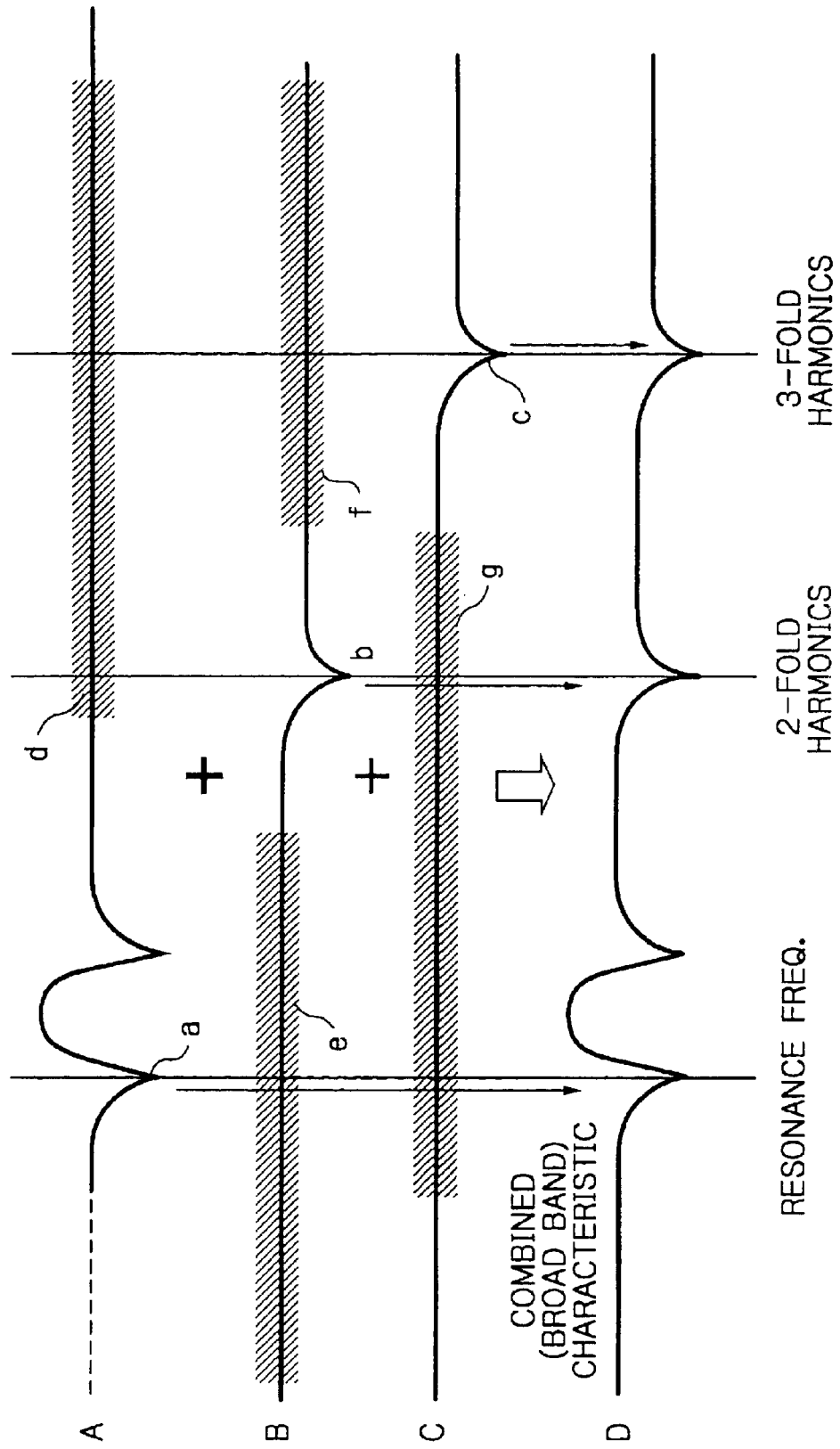
FIG. 9 demonstrates, similarly to FIG. 6, how the alternative embodiment generates attenuation poles at frequencies of two- and threefold harmonics of an attenuation pole frequency.

FIG. 9 demonstrates how attenuation poles are generated in the constant K SAW filter of the illustrative embodiment at two- and threefold harmonics of the attenuation pole frequency. In FIG. 9, a waveform A is representative of a relation between the frequency and the attenuation ratio of the resonator having the lowest resonance frequency. As shown, in the frequency range higher than the lowest resonance frequency, e.g. two or three times as high as the lowest resonance frequency, in practice 1.8 times or more but 2.2 times or less, or 2.7 times or above but 3.3 times or less, as high as the lowest resonance frequency, the curve A is substantially horizontal because the resonator simply plays the role of capacitance, as shown in FIG. 7B.

In FIG. 9, waveforms B and C are respectively representative of relations between the frequency and the attenuation ratio of the other parallel arm resonators, i.e. resonating devices having frequencies two times and three times as high as the lowest resonance frequency. As shown, the waveforms B and C, like the waveform A, are also substantially horizontal in the frequency range higher than the resonance frequency of the parallel arm resonators because each resonating device simply plays the role of capacitance.

The SAW filter of the illustrative embodiment has a characteristic represented by a curve D in FIG. 9, in which the waveform A derived from the ladder-connected parallel arm resonators is combined with the waveforms B and C derived from the resonating devices having the frequency two times and three times as high as the lowest resonance frequency, respectively. It is noteworthy that substantially horizontal ranges d, f and g included in the curves A, B and C, respectively, and two times and three times as high as the resonance frequency do not influence each other at all when combined.

The parallel arm resonators constituting one-terminal pair SAW resonators and the resonating devices constituting parallel arm resonating devices connected thereto all are implemented as one-terminal SAW resonators formed on a single substrate or separate substrates. Further, in the SAW filter, the resonating devices to be combined with the one-terminal pair SAW resonators, which constitute parallel arms, are implemented as bulk-wave piezoelectric resonators operable in, e.g. a thickness or a flexural oscillation mode and each being formed on a particular piezoelectric substrate or either one of a ferroelectric monocrystalline substrate and a ferroelectric ceramics substrate.

The resonating devices for the SAW filter are implemented by any one of an $LiTaO_3$ substrate having a crystal growth plane of 39±6° Y-X, an $LiTaO_3$ substrate having a crystal growth plane of X-112° Y, an $LiNbO_3$ substrate having a crystal growth plane of Y-Z, an $LiNbO_3$ substrate having a crystal growth plane of 64° Y-X, an $LiNbO_3$ substrate having a crystal growth plane of 41° Y-X, an $LiNbO_3$ substrate having a crystal growth plane of 128° Y-X, an $LiNbO_3$ substrate having a crystal growth plane of Y-Z, a PZT piezoelectric ceramics substrate, and a $PbTiO_3$ piezoelectric ceramics substrate.

Again, in the constant K SAW filter of the illustrative embodiment, a plurality of interdigital transducers are formed on a piezoelectric substrate or either one of a ferroelectric monocrystalline substrate and a ferroelectric ceramics substrate at a preselected pitch, constituting a one-terminal pair SAW resonator. Serial arm and parallel arm resonators each implemented by such a one-terminal pair SAW resonator are interconnected in a multiple-stage, ladder configuration. This configuration can approximate an equivalent lumped circuit which has resonance (serial resonance) and antiresonance (parallel resonance) and in which a serial connection of reactance L and capacitance C1 is connected in parallel to capacitance C2. In each parallel arm, the one-terminal pair SAW resonator constituting a constant K type and at least one resonating device having resonance and antiresonance at frequencies different from the above resonator are connected in parallel.

Generally, the resonance and antiresonance of a one-terminal pair SAW resonator have a quality factor of at least 100. It follows that at and around the resonance and antiresonance frequencies of the parallel arm of each stage, the resonating devices that are connected to be resonant to the two- or threefold harmonics play the role of mere capacitance. For example, at and around the resonance frequency of the parallel arm, part of the equivalent circuit of FIG. 7B indicated by a dotted block corresponds to the resonator 501 as in FIG. 1 while the capacitance C3 outside the dotted block corresponds to the additional resonating device 701.

That is also the case with the resonator 504 and the additional resonating device 702 in such a manner that the part indicated by the dotted block in the figure corresponds to the resonator 504 as in FIG. 1 while the capacitance C3 corresponds to the additional resonating device 702. On the other hand, at the resonance frequency of the resonating device 701 or 702, the resonating device 701 or 702 performs resonance and generates an attenuation pole while the parallel arm resonator 501 or 504 simply plays the role of capacitance. This relation between the resonator 501 or 504 and the resonating device 701 or 702 is shown in FIG. 9.

In FIG. 9, the waveform A is representative of the relation between the frequency and the attenuation ratio of the conventional constant K SAW filter. The waveform B is representative of the relation between the frequency and the attenuation ratio having an attenuation pole at the twofold harmonics and implemented by the resonating device 701. Further, the waveform C is representative of the relation between the frequency and the attenuation ratio having an attenuation pole at the threefold harmonics and implemented by the resonating device 702. The SAW filter of the illustrative embodiment combines the waveforms A, B and C.

In FIG. 9, the range d included in the waveform A, ranges e and f included in the waveform B and range g included in the waveform C each are two times or three times as high as its own attenuation pole frequency and therefore substantially horizontal as to characteristic, i.e. play the role of capacitance. Signals in the above ranges d through g have no influence on the attenuation pole characteristic. More specifically, the characteristic of the attenuation pole a of the signal A faithfully appears in the combined waveform D without being effected by the range e of the signal B and the range g of the signal C at all.

It will therefore be seen that, when an attenuation pole should be generated at harmonics any multiple of the attenuation pole frequency of the constant K SAW filter, a resonating device having an attenuation pole at the harmonics is added to the SAW filter. More specifically, at and around threefold harmonics, the inside of the dotted block of FIG. 7B and parallel-inserted capacitance C3 corresponds to the resonating device 702 and parallel arm resonator 504, respectively. Stated another way, inserting the parallel capacitance is equivalent to reducing the damping capacitance of the parallel arm resonator, so that the parallel arm as a whole constitutes a frequency elevation type, energy-confining, one-terminal pair SAW resonator. This not only reduces an insertion loss and increases the attenuation, but also generates attenuation poles at the two- and threefold harmonics.

If a parallel-arm resonating device other than the resonator having the lowest resonance frequency is connected to each of the consecutive stages, then the damping capacitance of the parallel arm resonator at each stage is reduced and, in turn, increases the quality factor of resonance and antiresonance of the resonator. Consequently, the insertion loss of the entire filter is reduced while the attenuation is increased at the attenuation pole frequency on the lower frequency side with respect to the passband. At the same time, the attenuation level is increased in both of the two- and threefold harmonics.

In the SAW filter, the damping capacitance of the parallel-arm resonating device whose resonance frequency is, in principle, two or three times as high as the resonance frequency at the lower frequency side with respect to the pass band is made equal to or higher than that of the parallel arm resonator at the resonance frequency on the lower frequency side. In this condition, if the resonating devices 701 and 702 have their resonance frequency matched such that the attenuation poles appear at the two- and threefold harmonics, respectively, then there can be implemented the desired attenuation at both of the two- and threefold harmonics.

If the resonating device to be inserted has damping capacitance two times or more higher than that of the associated resonator, then the insertion loss is aggravated little. The parallel-arm resonating devices of the illustrative embodiment each should preferably be positioned between parallel arm resonators from the characteristics standpoint.

As stated above, in the illustrative embodiment, a parallel arm resonating device having resonance frequency two or three times as high as that of a parallel arm resonator is connected in parallel to the parallel arm resonator. With this configuration, the illustrative embodiment achieves the following advantages (1) through (4).

(1) Two- or threefold harmonics can be attenuated by a greater amount without increasing an insertion loss.

(2) The resonating device connected in parallel to the parallel arm resonator in each stage lowers current to flow through the parallel arm resonator and thereby improves the resistance of the resonator to voltage or power.

(3) A printed circuit board is reduced in size because additional parts for trapping the two- and threefold harmonics are not necessary.

(4) Special, extra connecting steps and so forth that would increase the cost are not necessary.

While the illustrative embodiment has been shown and described as arranging the resonators on a single substrate, the resonators may be formed in separate substrates different in cut angle or in material and connected together by, e.g. bonding wires. If desired, the illustrative embodiment may also be modified to include five or more consecutive stages each including a parallel arm resonating device, thereby further enhancing the advantages described above.

In a further modified embodiment of the SAW filter in accordance with the present invention, the parallel arm resonators 701 and 702 may be implemented by piezoelectric resonators with resonance and antiresonance characteristics, i.e. bulk-wave resonators, each of which is connected to the parallel arm resonator of a particular stage. Each piezoelectric resonator has an attenuation pole at the frequency two or three times as high as the attenuation pole frequency formed by the parallel arm resonator associated therewith at the lower frequency side with respect to the pass band. The piezoelectric resonators 701 and 702 thus constitute resonating devices.

The resonating devices 701 and 702 connected in parallel to the conventional parallel arm resonator 501 and 504, respectively, each have a resonance frequency two or three times as high as a resonance frequency that forms an attenuation pole at the lower frequency side with respect to the pass band.

Generally, the resonance and antiresonance of a one-terminal SAW resonator have a quality factor of at least 100 as described earlier. It follows that at and around the resonance frequency of the parallel arm of each stage, the additional resonating device that is resonant to the two- or threefold harmonics simply plays the role of capacitance. On the other hand, at the resonance frequency of the resonating device 701 or 702 implemented by a piezoelectric resonator, the resonating device 701 or 702 generates an attenuation pole due to resonation while the parallel arm resonator 501 or 504 simply plays the role of capacitance. Stated another way, so inserting parallel capacitance in each stage is equivalent to increasing the damping capacitance of the associated parallel arm resonator, so that an attenuation pole is generated in the two- or threefold harmonics of the resonance frequency. Consequently, there can be increased the attenuation at the two- or threefold harmonics of the resonance frequency of the parallel arm resonators included in the entire filter.

To insert the resonating device 701 and 702 without noticeably increasing the insertion loss, the damping capacitance of each of the parallel arm resonators 501 and 504 should only be halved. This can be done only if the damping capacitance of each of the resonating devices 701 and 702 is made equal to that of the parallel arm resonator 501 and 504 associated therewith. More specifically, the parallel arm resonators 502 and 503 should only be replaced with piezoelectric resonators identical in damping capacitance with the resonators 502 and 503, but having resonance frequencies in the two- and threefold harmonics, respectively, of the resonance frequency.

As stated above, in the illustrative embodiment, a piezoelectric resonator, or bulk-wave resonator, having resonance and antiresonance characteristics is connected to a parallel arm resonator in parallel. With this configuration, the illustrative embodiment achieves the following advantages.

(1) Two- or threefold harmonics can be attenuated by a greater amount without increasing an insertion loss.

(2) The piezoelectric resonator connected to the parallel arm resonator at each stage in parallel reduces current to flow through the parallel arm resonator, so that the resistance of the parallel arm resonator to voltage or power is enhanced.

(3) Special manufacturing steps that would increase the cost are not necessary.

While the piezoelectric resonators of the illustrative embodiment are formed on separate substrates and connected together by bonding wires, they may be directly connected to each other via, e.g. bumps. While the illustrative embodiment has concentrated on a four-stage constant K filter, it may, of course, include five or more stages each including the additional resonating device in order to further enhance the above advantages. Further, the resonating device inserted in each stage can achieve the same advantages even if positioned between any other parallel arm resonators.

In the illustrative embodiments shown and described, additional resonating devices are connected only to either one of serial arm resonators and parallel arm resonators. Alternatively, additional resonating devices may even be connected to both of serial arm resonators and parallel arm resonators for the following reason. The antiresonance frequency and attenuation pole of a serial arm resonator and the resonance frequency and attenuation pole of a parallel arm resonator are positioned remote from each other at both sides of a pass band. Theoretically, therefore, attenuation poles are formed at both sides of a pass band even at frequency ranges two times and three times as high as the antiresonance frequency and resonance frequency at the higher frequency side. In practice, at least attenuation poles are formed even if the pass band slightly varies. It follows that the above alternative arrangement can also implement a small insertion loss and a great attenuation and increases the attenuation at the two- and threefold harmonics of the resonance frequency.

In summary, it will be seen that the present invention provides a SAW filter achieving a small insertion loss and a great attenuation and capable of increasing the attenuation ratio of two- or threefold harmonics of a resonance frequency.

The entire disclosure of Japanese patent application No. 2002-165644 filed on Jun. 6, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A constant K SAW (Surface Acoustic Wave) filter comprising:

a plurality of serial arm resonators and a plurality of parallel arm resonators interconnected in pairs in a multiple-stage, ladder configuration; and a resonating device serially connected to one of said serial arm resonators and having an attenuation pole frequency higher than an attenuation pole frequency of said one of said serial arm resonators, said resonating device functioning, at the attenuation pole frequency of said one of said serial arm resonators, as a capacitance without performing substantial attenuation, wherein said resonating device has an antiresonance frequency ranging from 1.8 times to 2.2 times inclusive, or ranging from 2.7 times to 3.3 times inclusive, as high as an antiresonance frequency of said one of said serial arm resonators, and wherein said resonating device has a damping capacitance higher than a damping capacitance of said one of said serial arm resonators.

2. A constant K SAW filter comprising:

a plurality of serial arm resonators and a plurality of parallel arm resonators interconnected in pairs in a multiple-stage, ladder configuration; and a resonating device connected to one of said parallel arm resonators in parallel and having an attenuation pole frequency higher than an attenuation pole frequency of said one of said parallel arm resonators, said resonating device functioning, at the attenuation pole frequency of said one of said parallel arm resonators, as a capacitance without performing substantial attenuation, wherein said resonating device has a resonance frequency ranging from 1.8 times to 2.2 times inclusive, or ranging from 2.7 times to 3.3 times inclusive, as high as a resonance frequency of said one of said parallel arm resonators, and wherein said resonating device has a damping capacitance substantially equal to or higher than a damping capacitance of said one of said parallel arm resonators.

3. A constant K SAW filter comprising:

a plurality of serial arm resonators and a plurality of parallel arm resonators interconnected in pairs in a multiple-state, ladder configuration; and a resonating device serially connected to one of said serial arm resonators and having an attenuation pole frequency higher than an attenuation pole frequency of said one of said serial arm resonators, said resonating device functioning, at the attenuation pole frequency of said one of said serial arm resonators, as a capacitance without performing substantial attenuation, wherein said resonating device has an antiresonance frequency that is any multiple of an antiresonance frequency of said one of said serial arm resonators, and wherein said resonating device has a damping capacitance higher than a damping capacitance of said one of said serial arm resonators.

4. The SAW filter in accordance with claim 3, wherein said resonating device comprises a one-terminal pair SAW resonator formed on a single substrate.

5. The SAW filter in accordance with claim 3, wherein said resonating device comprises a bulk-wave piezoelectric resonator constituted by a separate piezoelectric substrate or either one of a ferroelectric monocrystalline substrate and a ferroelectric ceramics substrate.

6. The SAW filter in accordance with claim 3, wherein said resonating device comprises a piezoelectric thin-film resonator formed on a single substrate.

7. The SAW filter in accordance with claim 6, wherein said piezoelectric thin-film resonator comprises any one of an $LiTaO_3$ thin film, an $LiNbO_3$ thin film, a ZnO thin film, and an AlN thin film.

8. The SAW filter in accordance with claim 3, wherein said resonating device is constituted by any one of an $LiTaO_3$ substrate with a crystal growth plane of 36° Y-X, an $LiTaO_3$ substrate with a crystal growth plane of X 112° Y, an $LiTaO_3$ substrate with a crystal growth plane of Y-Z, an $LiNbO_3$ substrate with a crystal growth plane of 64° Y-X, an $LiNbO_3$ substrate with a crystal growth plane of 41° Y-X, an $LiNbO_3$ substrate with a crystal growth plane of 128° Y-X, an $LiNbO_3$ substrate with a crystal growth plane of Y-Z, a PZT piezoelectric ceramics substrate, and a $PbTiO_3$ piezoelectric substrate.

9. A constant K SAW filter comprising:
a plurality of serial arm resonators and a plurality of parallel arm resonators interconnected in pairs in a multiple-stage, ladder configuration; and
a resonating device connected to one of said parallel arm resonators in parallel and having an attenuation pole frequency higher than an attenuation pole frequency of said one of said parallel arm resonators, said resonating device functioning, at the attenuation pole frequency of said one of said parallel arm resonators, as a capacitance without performing substantial attenuation, wherein said resonating device has a resonance frequency that is any multiple of a resonance frequency of said parallel arm resonator, and wherein said resonating device has a damping capacitance substantially equal to or higher than a damping capacitance of said one of said parallel arm resonators.

10. The SAW filter in accordance with claim 9, wherein said resonating device comprises a one-terminal pair SAW resonator formed on either one of a single substrate and a separate substrate.

11. The SAW filter in accordance with claim 9, wherein said resonating device comprises a bulk-wave piezoelectric resonator constituted by a separate piezoelectric substrate or either one of a ferroelectric monocrystalline substrate and a ferroelectric ceramics substrate.

12. The SAW filter in accordance with claim 11, wherein said resonating device comprises a bulk-wave piezoelectric resonator formed on a separate piezoelectric substrate or either one of a ferroelectric monocrystalline substrate and a ferroelectric ceramics substrate and resonating in either one of a thickness mode and a flexural mode.

13. The SAW filter in accordance with claim 9, wherein said resonating device comprises a piezoelectric thin-film resonator formed on a single substrate.

14. The SAW filter in accordance with claim 13, wherein said piezoelectric thin-film resonator comprises any one of an $LiTaO_3$ thin film, an $LiNbO_3$ thin film, a ZnO thin film, and an AlN thin film.

15. The SAW filter in accordance with claim 9, wherein said resonating device is formed by any one of an $LiTaO_3$ substrate with a crystal growth plane of 39±6° Y-X, an $LiTaO_3$ substrate with a crystal growth plane of X-112° Y, an $LiTaO_3$ substrate with a crystal growth plane of Y-Z, an $LiNbO_3$ substrate with a crystal growth plane of 64° Y-X, an $LiNbO_3$ substrate with a crystal growth plane of 41° Y-X, an $LiNbO_3$ substrate with a crystal growth plane of 128° Y-X, an $LiNbO_3$ substrate with a crystal growth plane of Y-Z, a PZT piezoelectric ceramics substrate, and a $PbTiO_3$ piezoelectric substrate.

* * * * *

UNITED STATES PATENT AND TRADEMARK OFFICE
CERTIFICATE OF CORRECTION

| | | |
|---|---|---|
| PATENT NO. | : 6,844,795 B2 | |
| APPLICATION NO. | : 10/369501 | |
| DATED | : January 18, 2005 | |
| INVENTOR(S) | : Naoto Inose | |

It is certified that error appears in the above-identified patent and that said Letters Patent is hereby corrected as shown below:

TITLE PAGE IN THE REFERENCES CITED (56):

Item [30] Col. 2, Foreign Patent Documents, remove Japanese Patent No. 9-61783 and replace it with the correct Japanese Patent No. JP 6-61783

Signed and Sealed this
Twelfth Day of June, 2012

David J. Kappos
*Director of the United States Patent and Trademark Office*